(12) United States Patent
Sidhu et al.

(10) Patent No.: US 8,809,181 B2
(45) Date of Patent: Aug. 19, 2014

(54) MULTI-SOLDER TECHNIQUES AND CONFIGURATIONS FOR INTEGRATED CIRCUIT PACKAGE ASSEMBLY

(71) Applicant: Intel Corporation, Santa Clara, CA (US)

(72) Inventors: Rajen S. Sidhu, Chandler, AZ (US); Wei Hu, Chandler, AZ (US); Carl L. Deppisch, Chandler, AZ (US); Martha A. Dudek, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/670,687

(22) Filed: Nov. 7, 2012

(65) Prior Publication Data

US 2014/0124925 A1    May 8, 2014

(51) Int. Cl.
*H01L 21/44* (2006.01)
(52) U.S. Cl.
USPC .................................. 438/612; 257/E21.509
(58) Field of Classification Search
USPC ............ 438/612, 614; 257/E21.508, E21.509
See application file for complete search history.

(56) References Cited

U.S. PATENT DOCUMENTS

| 8,470,643 B2* | 6/2013 | Tanaka ........................... 438/113 |
| 2010/0096754 A1* | 4/2010 | Lee et al. ...................... 257/738 |

\* cited by examiner

*Primary Examiner* — Quoc Hoang
(74) *Attorney, Agent, or Firm* — Schwabe, Williamson & Wyatt, P.C.

(57) ABSTRACT

Embodiments of the present disclosure are directed towards multi-solder techniques and configurations for integrated circuit (IC) package assembly. In one embodiment, a method includes depositing a plurality of solder balls on a plurality of pads of a package substrate, the plurality of solder balls corresponding with the plurality of pads and performing a solder reflow process to form a solder joint between the plurality of solder balls and the plurality of pads. Individual solder balls of the plurality of solder balls include a first solder material and a second solder material, the first solder material having a liquidus temperature that is greater than a peak temperature of the solder reflow process and the second solder material having a liquidus temperature that is less than the peak temperature of the solder reflow process. Other embodiments may be described and/or claimed.

10 Claims, 6 Drawing Sheets

US 8,809,181 B2

MULTI-SOLDER TECHNIQUES AND CONFIGURATIONS FOR INTEGRATED CIRCUIT PACKAGE ASSEMBLY

FIELD

Embodiments of the present disclosure generally relate to the field of integrated circuits, and more particularly, to multi-solder techniques and configurations for integrated circuit (IC) package assembly.

BACKGROUND

An integrated circuit (IC) device such as, for example, a die may be mounted on a package substrate to form an IC package assembly. Solder balls may be attached to the package substrate to facilitate routing of electrical signals between the package substrate and a circuit board. In some cases, the package substrate may be warped as a result of a difference in coefficient of thermal expansion between materials of the package substrate and the mounted IC device. The warpage may result in inadequate contact of solder balls with the circuit board during a reflow process to attach the package substrate with the circuit board causing non-uniform collapse of the solder, which may result in defects such as bridging defects where adjacent solder balls fuse together. The non-uniform collapse may result, for example, owing to an oxide layer that may increase on non-contact solder balls and squeeze out and form a bridge with adjacent solder balls once the solder balls are back in contact with the circuit board. Such defects may increase as packaging technology accommodates package substrates having thinner IC devices and/or larger thermal solutions.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIG. 3A schematically illustrates an IC package assembly subsequent to depositing a flux material on pads of the package substrate, in accordance with some embodiments.

FIG. 3B schematically illustrates an IC package assembly subsequent to depositing solder balls on the flux material, in accordance with some embodiments.

FIG. 3C schematically illustrates an IC package assembly subsequent to depositing multi-solder balls on the flux material, in accordance with some embodiments.

FIG. 3D schematically illustrates an IC package assembly subsequent to performing a solder reflow process to form a solder connection between the solder balls and the pads and between the multi-solder balls and the pads, in accordance with some embodiments.

FIG. 3E schematically illustrates an IC package assembly subsequent to depositing a flux material on pads of a circuit board and bringing the solder balls and multi-solder balls of the package substrate in solderable contact with the flux material, in accordance with some embodiments.

DETAILED DESCRIPTION

Figure 1:
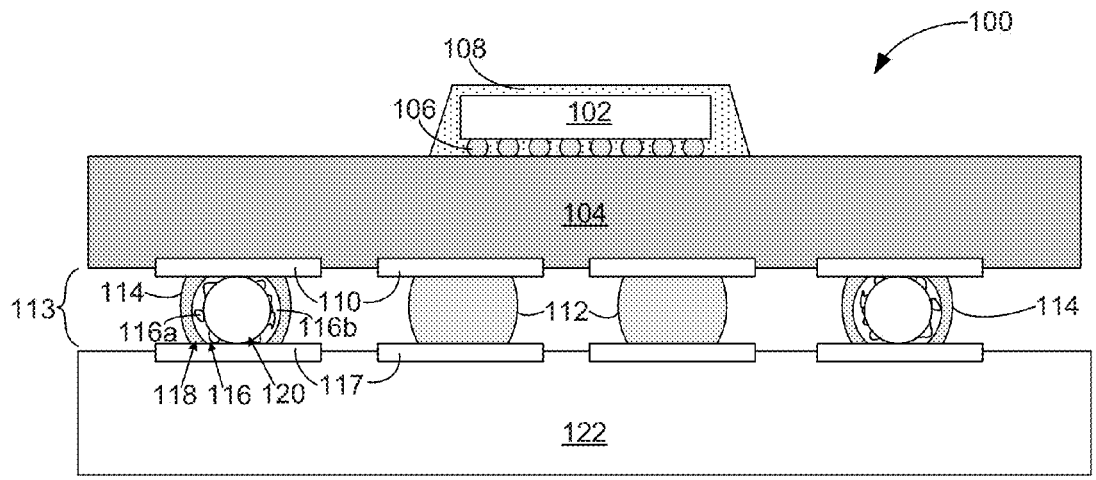
FIG. 1 schematically illustrates a cross-section side view of an example integrated circuit (IC) package assembly, in accordance with some embodiments.

Embodiments of the present disclosure describe multi-solder techniques and configurations for integrated circuit (IC) package assembly. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature," may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 schematically illustrates a cross-section side view of an example integrated circuit (IC) package assembly, in accordance with some embodiments. The IC package assembly 100 may include a package substrate 104 having one or more dies (hereinafter "die 102") mounted on the package substrate 104.

The die 102 can be attached to the package substrate 104 according to a variety of suitable configurations including, a flip-chip configuration, as depicted, or other configurations such as wirebonding and the like. In the flip-chip configuration, an active side of the die 102 is attached to a surface of the package substrate 104 using die interconnect structures 106 such as bumps, pillars, or other suitable structures. The active side of the die 102 may have one or more transistor devices formed thereon. The die 102 may represent a discrete chip and may be, include, or be a part of a processor, memory, or ASIC in some embodiments. In some embodiments, an encapsulant 108 such as, for example, molding compound or underfill material may fully or partially encapsulate the die 102.

The die interconnect structures 106 may be configured to route electrical signals between the die 102 and the package substrate 104. In some embodiments, the electrical signals may include, for example, input/output (I/O) signals and/or power or ground signals associated with the operation of the die 102.

The package substrate 104 may include electrical routing features configured to route electrical signals to or from the die 102. The electrical routing features may include, for example, traces (not shown) disposed on one or more surfaces of the package substrate 104 and/or internal routing features such as, for example, trenches, vias or other interconnect structures (not shown) to route electrical signals through the package substrate 104. For example, in some embodiments, the package substrate 104 may include electrical routing features such as die bond pads (not shown) configured to receive the die interconnect structures 106 and route electrical signals between the die 102 and the package substrate 104.

In some embodiments, the package substrate 104 is an epoxy-based laminate substrate having a core and/or build-up layers such as, for example, an Ajinomoto Build-up Film (ABF) substrate. The package substrate 104 may include other suitable types of substrates in other embodiments including, for example, substrates formed from glass, ceramic, or semiconductor materials.

In some embodiments, the circuit board 122 may be a printed circuit board (PCB) composed of an electrically insulative material such as an epoxy laminate. For example, the circuit board 122 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Structures (not shown) such as traces, trenches, vias may be formed through the electrically insulating layers to route the electrical signals of the die 102 through the circuit board 122. The circuit board 122 may be composed of other suitable materials in other embodiments. In some embodiments, the circuit board 122 is a motherboard (e.g., motherboard 502 of FIG. 5).

Package level interconnects including solder material such as, for example, solder balls 112 and multi-solder balls 114, may be coupled to one or more pads (hereinafter "pads 110") on the package substrate 104 and/or one or more pads (hereinafter "pads 117") on the circuit board 122 to form corresponding solder joints that are configured to further route the electrical signals to circuit board 122. The pads 110, 117 may be composed of any suitable electrically conductive material such as metal including, for example, nickel (Ni), palladium (Pd), gold (Au), silver (Ag), copper (Cu), and combinations thereof.

The solder balls 112 may be composed of a single solder material. The solder balls 112 may, for example, be composed of a single, contiguous alloy material. In one embodiment, the solder balls 112 are composed of an alloy including tin (Sn), silver (Ag) and copper (Cu) such as, for example, an Sn—Ag—Cu (SAC) alloy.

According to various embodiments, the multi-solder balls 114 may be composed of multiple solder materials having different liquidus temperatures. For example, in some embodiments, the multi-solder balls 114 may include a first solder material 116 and a second solder material 118. The first solder material 116 may have a liquidus temperature that is greater than a peak temperature of a first solder reflow process (hereinafter "first reflow process") that is used to form solder joints 113 between the multi-solder balls 114 and the pads 110 of the package substrate 104 and/or a second solder reflow process (hereinafter "second reflow process") that is used to form solder joints 113 between the multi-solder balls 114 and pads 117 of the circuit board 122. The second solder material 118 may have a liquidus temperature that is less than a peak temperature of the first reflow process and/or the second reflow process. According to various embodiments, the peak temperature of the first reflow process and/or the second reflow process may be a temperature ranging from 230° C. to 250° C.

The first reflow process and the second reflow process are not necessarily order dependent. For example, in some embodiments, the second reflow process to form solder joints 113 between the multi-solder balls 114 and pads 117 of the circuit board 122 may be performed prior to performing the first reflow process to form solder joints 113 between the multi-solder balls 114 and the pads 110 of the package substrate 104. Although the description generally describes the fabrication of the IC package assembly 100 in a scenario where the first reflow process is performed prior to the second reflow process, similar principles may apply to a scenario where the second reflow process is performed prior to the first reflow process.

According to various embodiments, the first solder material 116 may be composed of an off-eutectic alloy having a solidus temperature that is less than the peak temperature of the first reflow process and/or the second reflow process. In such embodiment, the first solder material 116 may have a liquidus temperature greater than 260° C. In some embodiments, the first solder material 116 may be composed of an alloy of tin (Sn) and copper (Cu) such as, for example, Sn-3Cu. The first solder material 116 may be composed of other suitable materials in other embodiments.

The second solder material 118 may be composed of a wide variety of suitable alloys including, for example, an alloy of tin (Sn), Silver (Ag) and copper (Cu) such as, for example, a SAC alloy. In some embodiments, the second solder material 118 may be composed of a same material that is used as a single material for the solder balls 112. In some embodiments, the second solder material 118 may have a liquidus temperature that is less than 250° C. The second solder material 118 may be composed of other suitable material in other embodiments.

In an embodiment, the first solder material 116 is composed of a Sn-3Cu alloy having a liquidus temperature of about 300° C. and the second solder material 118 is composed of a Sn-4% Ag0.5% Cu (SAC405) alloy. At the peak temperature of the first reflow process and/or the second reflow process, the first solder material 116 composed of Sn-3Cu alloy may be a mixture of solid phase portions 116a composed of Cu6Sn5 and liquid phase portions 116b composed of Sn.

In other embodiments, the first solder material 116 has a solidus temperature that is greater than a peak temperature of the first reflow process and/or the second reflow process. In such embodiments, the first solder material 116 may have a solidus temperature greater than 260° C. Such first solder material 116 may be composed of a wide variety of suitable alloys including an alloy of bismuth (Bi) and silver (Ag), an alloy of cadmium (Cd) and zinc (Zn), an alloy of tin (Sn), silver (Ag), and antimony (Sb), like materials, or suitable combinations thereof.

Mechanical properties of a first solder material 116 having a solidus temperature that is greater than the peak temperature of the reflow processes may be closer to the mechanical properties of a SAC alloy that may be used for the second solder material 118 than mechanical properties of a first solder material 116 (e.g., Sn-3Cu) having a having a liquidus temperature that is greater than the peak temperature of the reflow processes and a solidus temperature that is less than the peak temperature of the reflow processes. Such mechanical properties of the first solder material 116 having the solidus temperature that is greater than the peak temperature of the reflow processes may prevent or reduce premature failure of solder joints 113 during dynamic loading and thermal cycling. A material property mismatch for such first solder material 116 relative to a core 120 composed of copper (Cu) may be smaller than a SAC alloy (e.g., SAC405) relative to the core 120 composed of copper, as can be seen in Table 1. Table 1 compares a Young's modulus value in Gigapascals (GPa) of various example solder materials that may be used for the first solder material 116 such as, for example, Bi—Ag, Sn—Ag—Sb, Sn-(5%-10%)Ag, Sn-(2% to 8%)Cu to Copper, which may be used for the core 120, and SAC405, which may be used for the second solder material 118, in accordance with various embodiments.

TABLE 1

Young's Modulus of Example Solder Materials Relative to Copper

| Material | Young's Modulus (GPa) |
|---|---|
| Copper | 120 |
| Sn—4%Ag—0.5%Cu(SAC405) | 50 |
| Bi—Ag | 30-50 |
| Sn—Ag—Sb | 60-70 |
| Sn—(5%-10%)Ag | 60-70 |
| Sn—(2%-8%)Cu | 60-70 |

The first solder material 116 of the multi-solder balls 114 may be an inner material that is disposed in an inner region of the multi-solder balls 114 relative to the second solder material 118, which may be an outer material relative to the first solder material 116, as can be seen. In some embodiments, the second solder material 118 is a surface layer of the multi-solder balls 114.

The solder balls 112 and/or the multi-solder balls 114 may be composed of additional materials including non-solder materials. For example, in the depicted embodiment, the multi-solder balls 114 further include a core 120. The core 120 may be composed of a material that maintains solid form rigidity throughout the first reflow process and/or the second reflow process. The core 120 may serve as a structural barrier that defines or otherwise provides a collapse distance between the package substrate 104 and the circuit board 122 during the second reflow process. The core 120 may prevent or reduce collapse defects such as bridging defects between adjacent solder balls (e.g., solder balls 112 and/or multi-solder balls 114) of the IC package assembly 100.

In some embodiments, a diameter of the core 120 may be designed or otherwise configured to provide the collapse distance, which may be a distance between corresponding pads 110 and 117 of the respective package substrate 104 and circuit board 122 in the IC package assembly 100. In some embodiments, the core 120 has a spherical shape and is composed of a polymer or metal. The core 120 may have other shapes and may be composed of other suitable materials in other embodiments.

In some embodiments, prior to performing the first reflow process, the first solder material 116 may be disposed to surround the core 120 and the second solder material 118 may be disposed to surround the first solder material 116. In some embodiments, subsequent to performing the first reflow process and/or the second reflow process, the first solder material 116 may be disposed to substantially surround the core 120. For example, the first solder material 116 may be a majority of solder material that is in direct contact with the core 120.

According to various embodiments, the solder balls 112 may be disposed on pads (e.g., 110 or 117) corresponding with a central region of the package substrate 104 (e.g., under a die shadow of the die 102) and the multi-solder balls 114 may be disposed on pads corresponding with a peripheral region of the package substrate 104. Such configuration may provide additional structural support by the multi-solder balls 114 in areas of the IC package assembly 100 that may be more greatly affected by defects associated with warpage of the package substrate 104 during thermal processes and provide solder balls 112, which may have a lower cost relative to the multi-solder balls 114, in areas of the IC package assembly 100 that may be less affected by defects associated with dynamic warpage such as solder bridging and non-wets, which may cause electrical failures.

The first solder material 116 may have solid phase portions 116a and liquid phase portions 116b at the peak temperature of the first reflow process in embodiments where the first solder material 116 is an off-eutectic alloy having a liquidus temperature that is greater than a peak temperature of the first reflow process and a solidus temperature that is less than the peak temperature of the first reflow process. The multi-solder balls 114 may include the core 120 in such embodiments to provide additional structural support to mitigate warpage defects. The first solder material 116 may have a less uniform or non-uniform microstructure (e.g., in cross-section analysis) and the second solder material 118 may have a more uniform or uniform microstructure. For example, the first solder material 116 may have grain structures consistent with multi-phase off-eutectic formation and corresponding with the solid phase portions 116a and liquid phase portions 116b.

During the first reflow process and/or the second reflow process, the liquid phase portions 116b may fuse together with the second solder material 118 to form uniform solder joints 113. During the first reflow process, solid phase portions 116a of the first solder material 116 may have a viscosity that retains a shape and adherence to the core 120 such that the solid phase portions 116a provide solderable material on a surface of the core 120 that is adjacent to pads 117 of the circuit board during the second reflow process. For example, in some embodiments, an example solder ball (not shown) having a core 120 and only the second solder material 118 as described herein (e.g., no first solder material 116) in direct contact with the core 120 may not provide sufficient solderable material on a surface of the core 120 to provide a reliable solder joint between the example solder ball and a pad (e.g., pads 117) of the circuit board 122. This may be due to excessive flow of the second solder material 118 towards the pad (e.g., pads 110) of the package substrate 104 during the first reflow process such that there is insufficient second solder material 118 on a surface of the core 120 that is placed in solderable contact with pads 117 of the circuit board 122 during the second reflow process. Use of the first solder material 116 in conjunction with the second solder material 118 and the core 120 may cure this defect.

The multi-solder balls 114 may not include a core 120 in embodiments where the first solder material 116 has a solidus temperature that is greater than the peak temperature of the first reflow process and/or the second reflow process. In such a case, the first solder material 116 may retain a solid phase rigidity that provides a structural barrier during the first reflow process and/or second reflow process. For example, the first solder material 116 may serve a similar function as the core 120. In other embodiments, the multi-solder balls 114 may include a core 120 in embodiments where the first solder material 116 has a solidus temperature that is greater than the peak temperature of the first reflow process and/or the second reflow process to lend additional structural support or to save cost on solderable materials.

Figure 2:
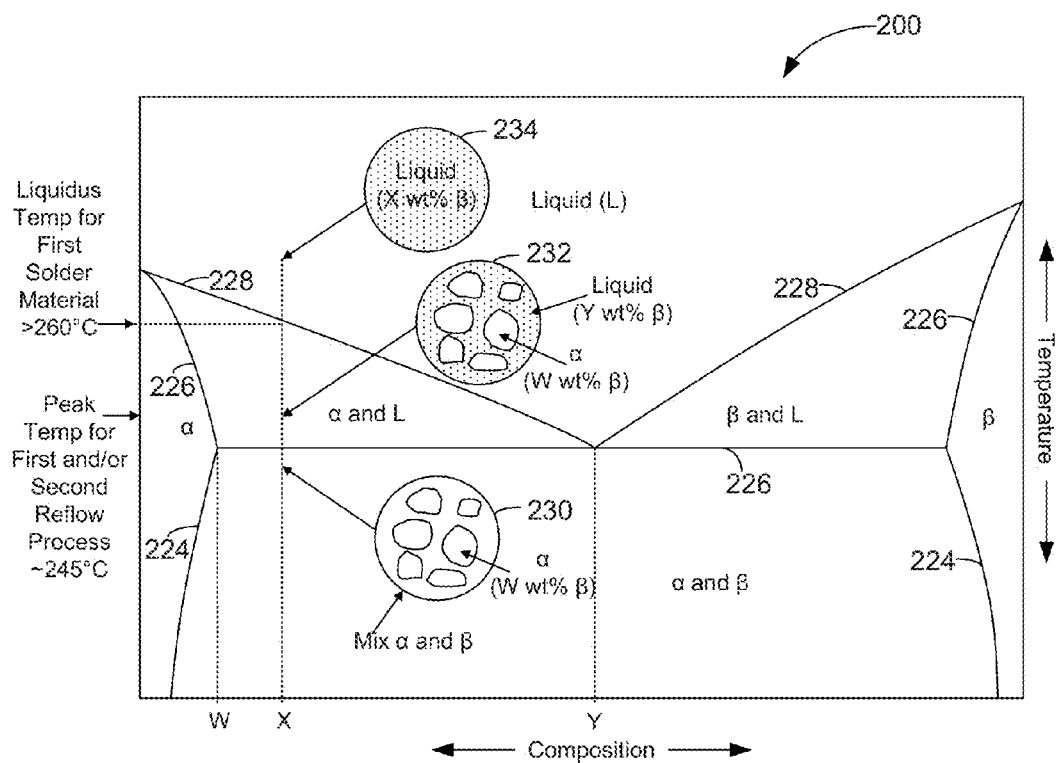
FIG. 2 schematically illustrates a binary phase diagram for a solder material, in accordance with some embodiments.

FIG. 2 schematically illustrates a binary phase diagram (hereinafter "diagram 200") for a solder material, in accordance with some embodiments. The diagram 200 may represent, for example, a binary phase diagram of the first solder material 116 of FIG. 1.

A horizontal axis of the diagram 200 represents a composition of the solder material and a vertical axis of the diagram 200 represents a temperature of the solder material. The diagram 200 includes solvus lines 224, solidus lines 226, and liquidus lines 228, demarcating boundaries between solid ($\alpha$ and $\beta$) and liquid (L) phases for the solder material according to temperature and composition. For example, $\alpha$ and $\beta$ may correspond with Cu and Sn. Eutectic composition Y corresponds with a eutectic point of the diagram 200 at an intersection of the liquidus lines 228 and the solidus line 226 as indicated by the dashed line. Composition W corresponds with a solubility limit and the maximum concentration of a phase. Composition X corresponds with an example off-eutectic solder material. The solid phase 230 of the solder material is depicted at a temperature below the solidus line 226 as indicated. The solid phase 230 may include a portion having a mix of $\alpha$ and $\beta$ and portions of a having W weight percent (wt %) $\beta$.

The solid and liquid phase 232 of the solder material having composition X is depicted at a temperature above the solidus line 226 and below the liquidus line 228 as indicated. The solid and liquid phase 232 may include a liquid portion having Y wt % $\beta$ and a solid portion having W wt %. The liquid phase 234 of the solder material having composition X is depicted at a temperature above the liquidus line 228 as indicated. The liquid phase 234 may include liquid having X wt % $\beta$.

According to various embodiments, the solder material having composition X (e.g., first solder material 116 of FIG. 1) may have a liquidus temperature that is greater than a peak temperature used for first and/or second reflow processes as described herein and a solidus temperature that is less than the peak temperature used for the first and/or second solder reflow processes, as indicated on the diagram 200. Compositions other than composition X may be used for the first solder material 116 of FIG. 1 in other embodiments. For example, the first solder material 116 of FIG. 1 may include hypereutectic, eutectic, or hypoeutectic compositions in other embodiments.

FIGS. 3A-E schematically illustrate an IC package assembly (e.g., IC package assembly 100 of FIG. 1) subsequent to various process operations. The techniques and configurations of FIGS. 3A-3E may comport with embodiments described in connection with FIGS. 1-2 and vice versa.

Figure 3A:
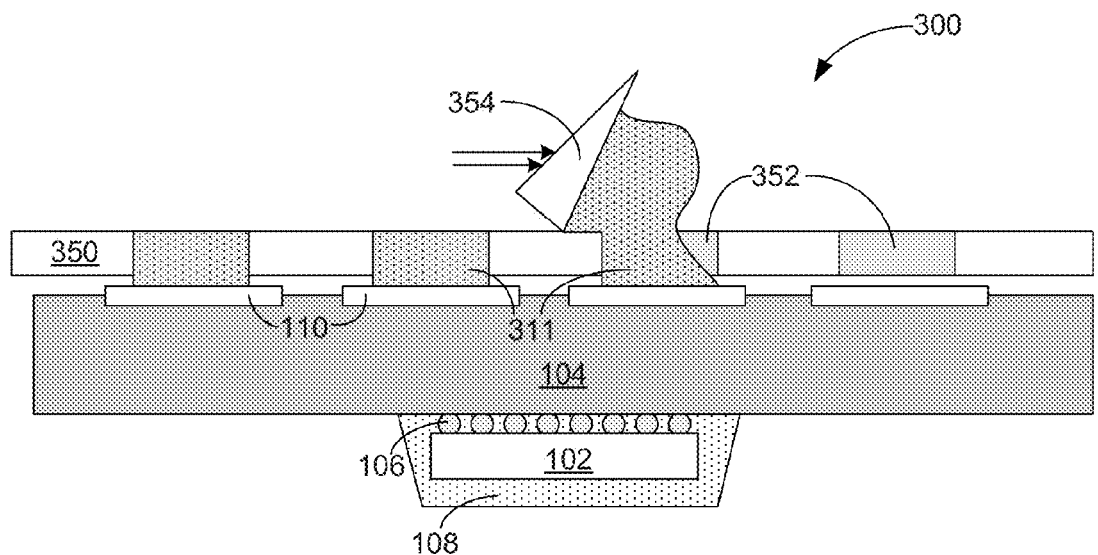
FIGS. 3A-E schematically illustrate an IC package assembly subsequent to various process operations, in accordance with various embodiments.

In FIG. 3A, the IC package assembly 300 is shown subsequent to depositing a flux material 311 on pads 110 of a package substrate 104, in accordance with some embodiments. In the depicted embodiment, the flux material 311 is deposited using a stencil printing method. For example, a squeegee 354 or analogous feature may be used to push (e.g., in the direction indicated by the arrows) the flux material 311 through the openings 352 of a stencil 350 adjacent to the pads 110. The flux material 311 may be deposited on the pads 110 using other suitable deposition techniques in other embodiments. In some embodiments, the flux material 311 may include one or more of a solder paste, rosin, thixotropic agent, solvent, amine, and acid.

Figure 3B:
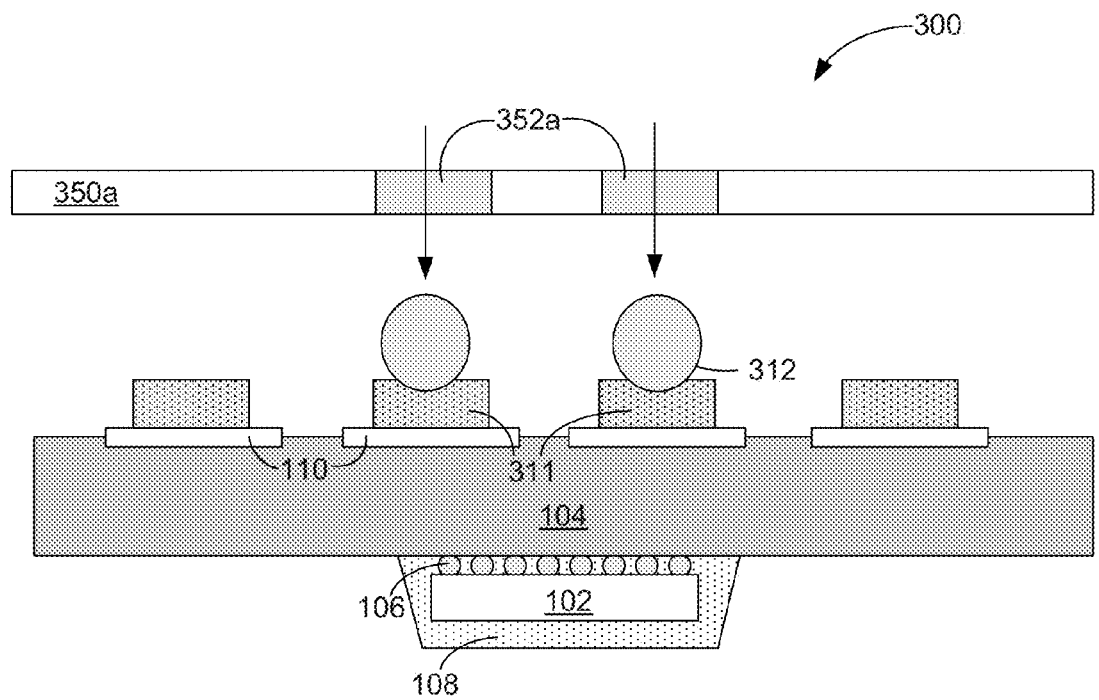

In FIG. 3B, the IC package assembly 300 is shown subsequent to depositing solder balls 312 on the flux material 311. For example, in the depicted embodiment, the solder balls 312 may be dropped in the direction of the arrows through openings 352a in a patterned grid 350a onto the flux material 311, as can be seen. The solder balls 312 may comport with embodiments described in connection with solder balls 112 of FIG. 1 in various embodiments. For example, the solder balls 312 may be placed in a central region of the package substrate 104.

Figure 3C:
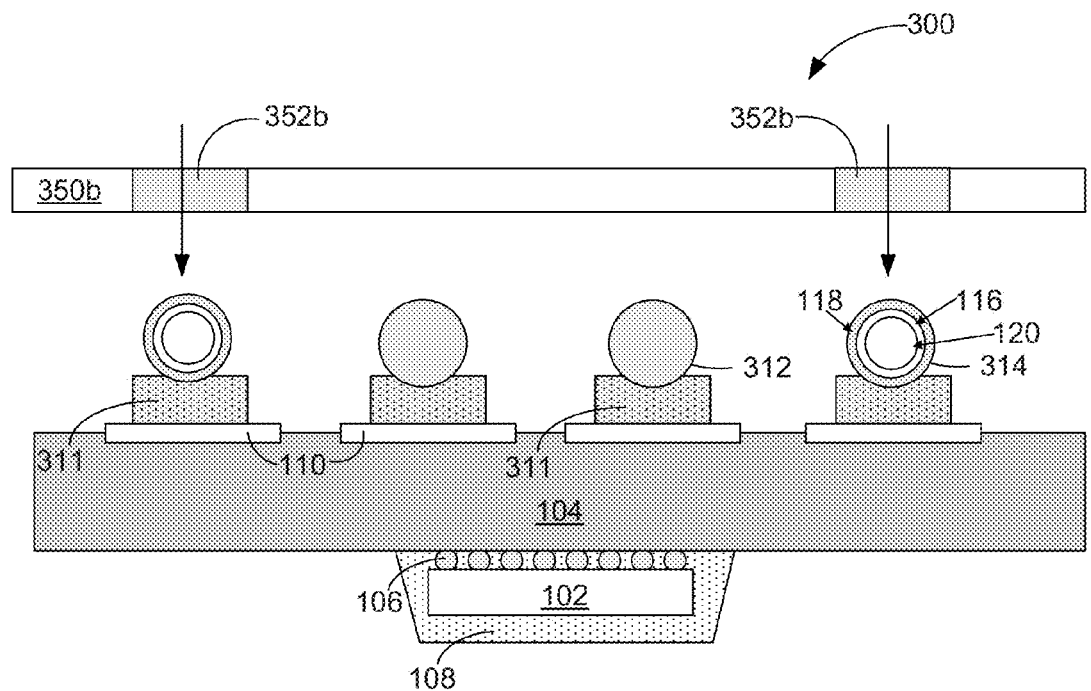

In FIG. 3C, the IC package assembly 300 is shown subsequent to depositing multi-solder balls 314 on the flux material 311. For example, in the depicted embodiment, the multi-solder balls 314 may be dropped in the direction of the arrows through openings 352b in a patterned grid 350b onto the flux material 311, as can be seen. The multi-solder balls 314 may comport with embodiments described in connection with multi-solder balls 114 of FIG. 1 in various embodiments. For example, the multi-solder balls 314 may include a core 120, a first solder material 116 and a second solder material 118. The multi-solder balls 314 may be placed in a peripheral region of the package substrate 104. In some embodiments, the solder balls 312 and the multi-solder balls 314 are substantially spherical in shape prior to reflow processes. In some embodiments, the solder balls 312 may be replaced with multi-solder balls 314 and, in such embodiments, the multi-solder balls 314 may be deposited using a single deposition operation.

Figure 3D:
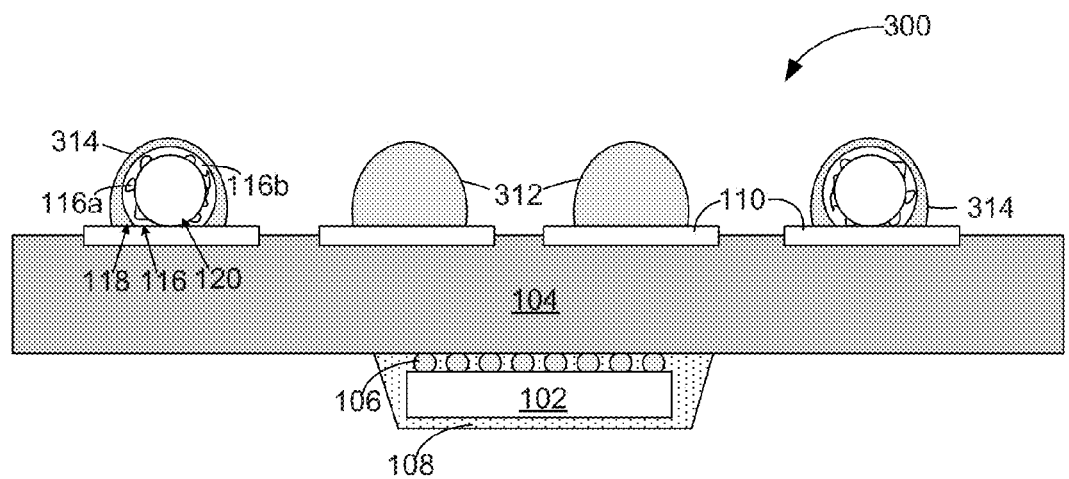

In FIG. 3D, the IC package assembly 300 is shown subsequent to performing a first reflow process to form solder joints between the solder balls 312 and the pads 110 and between the multi-solder balls 314 and the pads 110. In some embodiments, the liquid phase portions 116b of the first solder material 116 may fuse with the second solder material 118 to form the solder joints between the multi-solder balls 314 and the pads 110 during the first reflow process. In some embodiments, solid phase portions 116a of the first solder material 116 may remain on a top portion of the core 120 to provide solderable material for a second reflow process to form solder joints between the multi-solder balls 314 and pads of a circuit board.

Figure 3E:
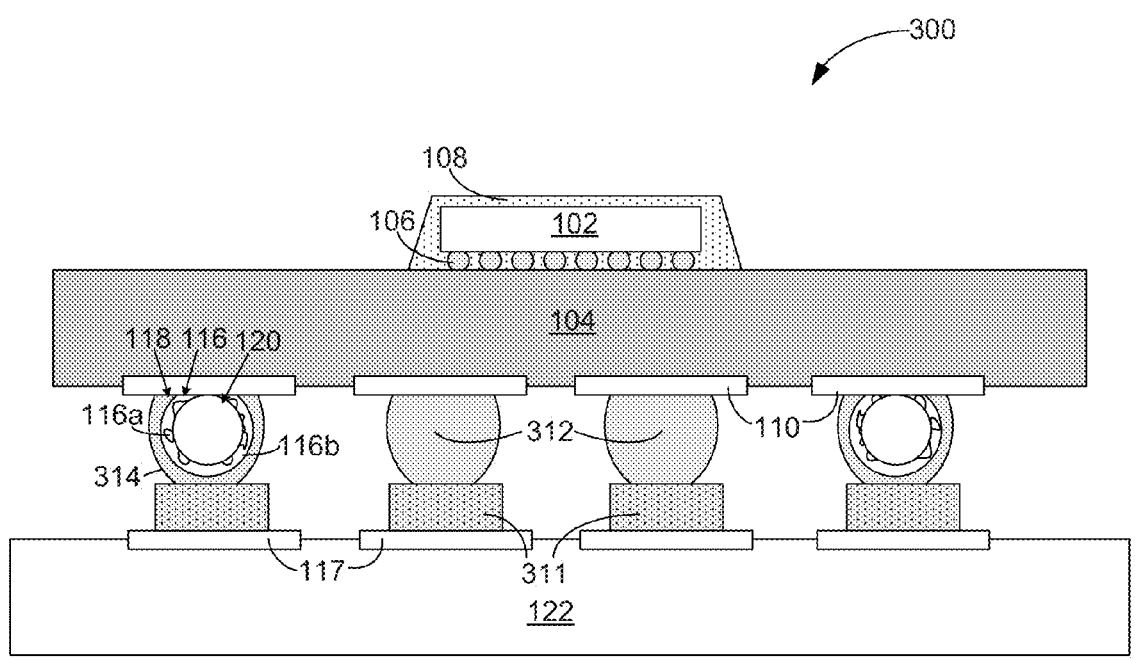

In FIG. 3E, the IC package assembly 300 is shown subsequent to depositing flux material 311 on pads 117 of a circuit board 122 and bringing the solder balls 312 and multi-solder balls 314 into solderable contact with the flux material 311, in preparation for a second reflow process to form solder joints between the solder balls 312 and the pads 117 and between the multi-solder balls 314 and the pads 117. In some embodiments, the liquid phase portions 116b of the first solder material 116 may fuse with the second solder material 118 to form the solder joints between the multi-solder balls 314 and the pads 117 during the second reflow process. The liquid phase portions 116b may include portions of the solid phase portions 116a that remain on the core 120 subsequent to the first reflow process. The IC package assembly 100 of FIG. 1 may represent the IC package assembly 300 of FIG. 3E subsequent to performing the second reflow process, according to various embodiments.

Figure 4:
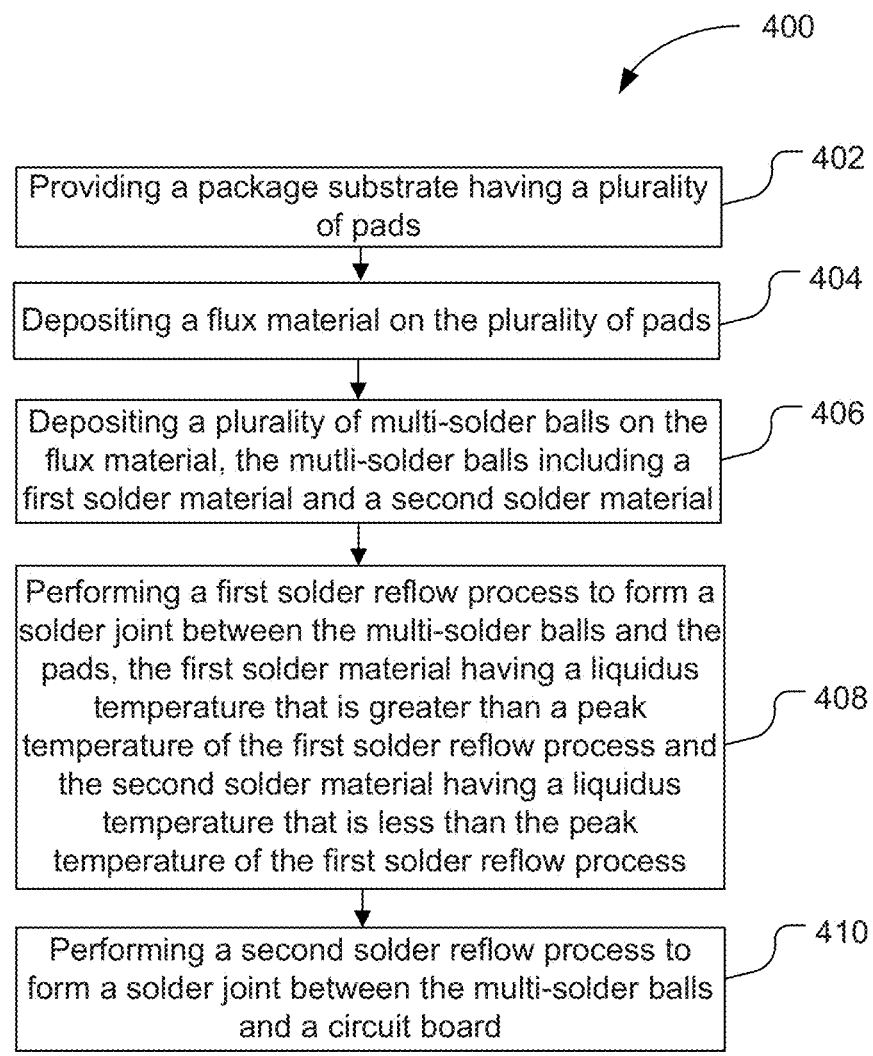
FIG. 4 schematically illustrates a flow diagram for a method of fabricating an IC package assembly, in accordance with some embodiments.

FIG. 4 schematically illustrates a flow diagram for a method 400 of fabricating an IC package assembly (e.g., IC package assembly 100 of FIG. 1 or IC package assembly 300 of FIGS. 3A-E), in accordance with some embodiments. The method 400 may comport with embodiments described in connection with FIGS. 1-3E.

At 402, the method 400 may include providing a package substrate (e.g., package substrate 104 of FIG. 3A) having a plurality of pads (e.g., pads 110 of FIG. 3A). At 404, the method may further include depositing a flux material (e.g., flux material 311 of FIG. 3A) on the plurality of pads.

At 406, the method 400 may further include depositing a plurality of multi-solder balls (e.g., multi-solder balls 314 of FIG. 3C) on the flux material, the multi-solder balls including a first solder material (e.g., first solder material 116 of FIG. 3C) and a second solder material (e.g., second solder material 118 of FIG. 3C). In some embodiments, the first solder material may be disposed to surround a core (e.g., core 120 of FIG. 3C) and the second solder material may be disposed to surround the first solder material in some embodiments. The core may be configured to provide a structural barrier that provides a collapse distance between the package substrate and a circuit board (e.g., circuit board 122 of FIG. 3E) during a second solder reflow process to prevent collapse or bridging defects. In some embodiments, the multi-solder balls may be placed on pads that are disposed in a peripheral region of the package substrate and solder balls (e.g., solder balls 312 of FIG. 3C) composed of a single, contiguous alloy material may be placed on pads in a peripheral region of the package substrate.

At 408, the method 400 may further include performing a first solder reflow process to form a solder joint between the multi-solder balls and the pads, the first solder material having a liquidus temperature that is greater than a peak temperature of the first solder reflow process and the second solder material having a liquidus temperature that is less than the peak temperature of the first solder reflow process. In some embodiments, the first solder material may be an off-eutectic alloy. In one embodiment, the first solder material may have a solidus temperature that is less than the peak temperature of the first solder reflow process. In another embodiment, the first solder material may have a solidus temperature that is greater than the peak temperature of the first solder reflow process. In some embodiments, the peak temperature of the first solder reflow process is a temperature from 230° C. and 250° C.

At 410, the method 400 may further include performing a second solder reflow process to form a solder joint between the multi-solder balls and a circuit board (e.g., circuit board 122 of FIG. 3E). In some embodiments, the first solder material may be have a liquidus temperature that is greater than a peak temperature of the second solder reflow process and the second solder material may have a liquidus temperature that is less than the peak temperature of the second solder reflow process. In one embodiment, the first solder material may have a solidus temperature that is less than the peak temperature of the second solder reflow process. In another embodiment, the first solder material may have a solidus temperature that is greater than the peak temperature of the second solder reflow process. In some embodiments, the peak temperature of the second solder reflow process is a temperature from 230° C. and 250° C.

Figure 5:
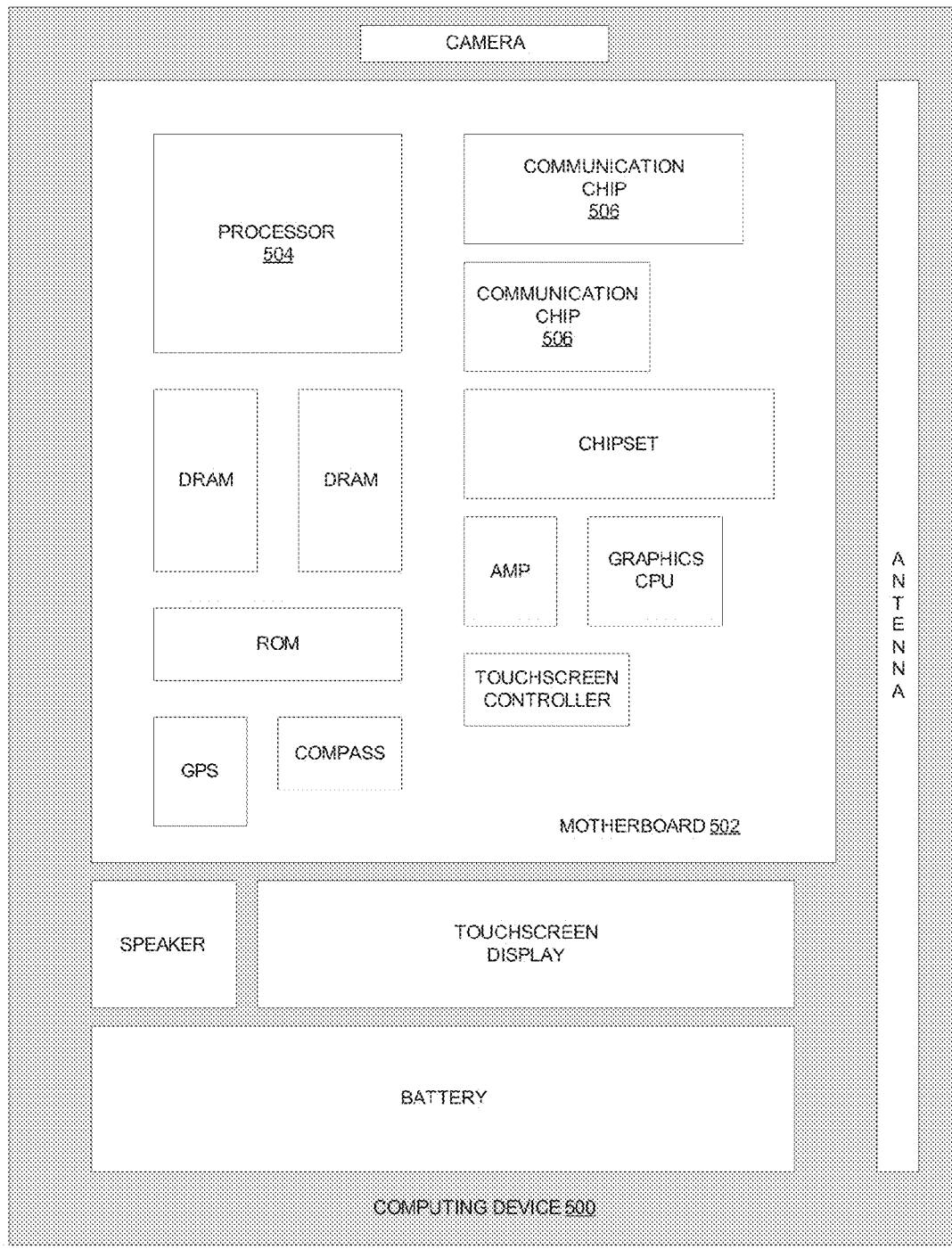
FIG. 5 schematically illustrates a computing device in accordance with one implementation of the invention.

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired. FIG. 5 schematically illustrates a computing device 500 in accordance with one implementation of the invention. The computing device 500 may house a board such as motherboard 502. The motherboard 502 may include a number of components, including but not limited to a processor 504 and at least one communication chip 506. The processor 504 may be physically and electrically coupled to the motherboard 502. In some implementations, the at least one communication chip 506 may also be physically and electrically coupled to the motherboard 502. In further implementations, the communication chip 506 may be part of the processor 504.

Depending on its applications, computing device 500 may include other components that may or may not be physically and electrically coupled to the motherboard 502. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 506 may enable wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 506 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 506 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 506 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 506 may operate in accordance with other wireless protocols in other embodiments.

The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 may include a die (e.g., die 102 of FIG. 1) in an IC package assembly (e.g., IC package assembly 100 of FIG. 1) as described herein. For example, the circuit board 122 of FIG. 1 may be a motherboard 502 and the processor 504 may be a die 102 mounted on a package substrate 104 of FIG. 1. The package substrate 104 and the motherboard 502 may be coupled together using techniques and configurations described in connection with multi-solder balls 114 of FIG. 1. The term "processor" may refer to any device or portion of a device that processes electronic data from registers and/or memory to transform that electronic data into other electronic data that may be stored in registers and/or memory.

The communication chip 506 may also include a die (e.g., die 102 of FIG. 1) in an IC package assembly (e.g., IC package assembly 100 of FIG. 1) as described herein. In further implementations, another component (e.g., memory device or other integrated circuit device) housed within the computing device 500 may contain a die (e.g., die 102 of FIG. 1) in an IC package assembly (e.g., IC package assembly 100 of FIG. 1) as described herein.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

What is claimed is:

1. A method comprising:
depositing a plurality of solder balls on a plurality of pads of a package substrate, the plurality of solder balls corresponding with the plurality of pads;
performing a first solder reflow process to form a solder joint between the plurality of solder balls and the plurality of pads, wherein individual solder balls of the plurality of solder balls include a first solder material and a second solder material, the first solder material having a liquidus temperature that is greater than a peak temperature of the first solder reflow process and the second solder material having a liquidus temperature that is less than the peak temperature of the first solder reflow process; and
performing a second solder reflow process to form a solder joint between the plurality of solder balls and a circuit board, wherein the first solder material is an off-eutectic alloy having a liquidus temperature that is greater than a peak temperature of the second solder reflow process and a solidus temperature that is less than the peak temperatures of the first solder reflow process and the second solder reflow process, and the second solder material has a liquidus temperature that is less than the peak temperature of the second solder reflow process.

2. The method of claim 1, further comprising:
depositing a flux material including a solder paste on the plurality of pads of the package substrate prior to depositing the plurality of solder balls, wherein depositing the plurality of balls comprises depositing the plurality of balls on the flux material disposed on the plurality of pads.

3. The method of claim 1, wherein the peak temperatures of the first solder reflow process and the second solder reflow process are temperatures from 230° C. to 250° C.

4. The method of claim 1, wherein the individual solder balls include a core composed of a polymer or metal that is configured to provide a structural barrier that provides a collapse distance between the package substrate and the circuit board during said performing the second solder reflow process to prevent collapse or bridging defects.

5. The method of claim 4, wherein, prior to performing the first reflow process, the first solder material is disposed to substantially surround the core and the second solder material is disposed to substantially surround the first solder material.

6. The method of claim 1, wherein performing the second solder reflow process forms the solder joint between the first solder material and the second solder material of the plurality of solder balls and a corresponding plurality of pads on the circuit board.

7. The method of claim 1, wherein depositing the plurality of solder balls comprises:
placing one or more solder balls composed of a single, contiguous alloy material on corresponding one or more pads of the plurality of pads that are disposed in a central region of the package substrate; and
placing one or more of the individual solder balls on corresponding one or more pads of the plurality of pads that are disposed in a peripheral region of the package substrate.

8. The method of claim 1, wherein:
the first solder material includes an off-eutectic alloy of tin (Sn) and copper (Cu) having a liquidus temperature greater than 260° C.; and the second solder material includes an alloy of tin (Sn), silver (Ag), and copper (Cu).

9. A method comprising:
depositing a plurality of solder balls on a plurality of pads of a package substrate, the plurality of solder balls corresponding with the plurality of pads; and
performing a solder reflow process to form a solder joint between the plurality of solder balls and the plurality of pads, wherein individual solder balls of the plurality of solder balls include a first solder material and a second solder material, the first solder material having a liquidus temperature that is greater than a peak temperature of the solder reflow process and the second solder material having a liquidus temperature that is less than the peak temperature of the solder reflow process, wherein:
the first solder material includes an off-eutectic alloy of tin (Sn) and copper (Cu) having a liquidus temperature greater than 260° C. and a solidus temperature that is less than the peak temperature of the solder reflow process; and
the second solder material includes an alloy of tin (Sn), silver (Ag), and copper (Cu).

10. A method comprising:
depositing a plurality of solder balls on a plurality of pads of a package substrate, the plurality of solder balls corresponding with the plurality of pads; and
performing a solder reflow process to form a solder joint between the plurality of solder balls and the plurality of pads, wherein individual solder balls of the plurality of solder balls include a first solder material and a second solder material, the first solder material having a liquidus temperature that is greater than a peak temperature of the solder reflow process and the second solder material having a liquidus temperature that is less than the peak temperature of the solder reflow process, wherein:
the first solder material has a solidus temperature that is greater than the peak temperature of the solder reflow process;
the first solder material includes an alloy of bismuth (Bi) and silver (Ag), an alloy of cadmium (Cd) and Zinc (Zn), or an alloy of tin (Sn), silver (Ag) and antimony (Sb); and
the second solder material includes an alloy of tin (Sn), silver (Ag), and copper (Cu).

* * * * *